US008820351B1

(12) United States Patent
Harrington et al.

(10) Patent No.: US 8,820,351 B1
(45) Date of Patent: Sep. 2, 2014

(54) NO DRIP HOT SWAP CONNECTOR AND METHOD OF USE

(71) Applicants: Steve Harrington, Cardiff, CA (US); Peter C. Deangelis, San Juan Capistrano, CA (US); William C Campbell, Escondido, CA (US)

(72) Inventors: Steve Harrington, Cardiff, CA (US); Peter C. Deangelis, San Juan Capistrano, CA (US); William C Campbell, Escondido, CA (US)

(73) Assignee: Chilldyne, Inc., Carlsbad, CA (US)

( * ) Notice: Subject to any disclaimer, the term of this patent is extended or adjusted under 35 U.S.C. 154(b) by 0 days.

(21) Appl. No.: 14/205,777

(22) Filed: Mar. 12, 2014

Related U.S. Application Data

(60) Provisional application No. 61/839,246, filed on Jun. 25, 2013.

(51) Int. Cl.
*H05K 7/20* (2006.01)
*F16L 37/28* (2006.01)
*F16L 39/00* (2006.01)
*F25D 23/12* (2006.01)

(52) U.S. Cl.
CPC .................................. *H05K 7/20281* (2013.01)
USPC ..... 137/595; 137/614; 251/149.1; 285/124.1; 62/259.2

(58) Field of Classification Search
USPC ............... 137/594, 595, 613, 614; 251/149.1; 604/905; 285/124.1–124.5, 93, 307; 62/259.2
See application file for complete search history.

(56) References Cited

U.S. PATENT DOCUMENTS

| 418,408 | A | * | 12/1889 | Graver .......................... 137/595 |
| 2,016,746 | A | | 8/1933 | Ireland |
| 2,445,115 | A | | 4/1944 | Hanrahan |
| 2,359,648 | A | * | 10/1944 | Jones ............................ 137/594 |
| 2,628,850 | A | * | 2/1953 | Summerville ............. 251/149.7 |
| 3,224,109 | A | | 2/1963 | Turato |
| 3,235,003 | A | | 2/1966 | Smith |
| 3,352,124 | A | | 2/1966 | Watkins |
| 3,287,031 | A | * | 11/1966 | Simmons et al. ............... 285/27 |
| 3,334,684 | A | | 8/1967 | Roush et al. |
| 3,448,760 | A | * | 6/1969 | Cranage ......................... 137/360 |
| 3,730,221 | A | * | 5/1973 | Vik ................................ 137/614 |
| 3,797,317 | A | | 3/1974 | Peterson, Jr. |
| 3,992,894 | A | | 11/1976 | Antonetti et al. |
| 4,287,941 | A | | 9/1981 | Allen |
| 4,436,125 | A | * | 3/1984 | Blenkush ...................... 141/330 |
| 4,443,389 | A | | 4/1984 | Dodds |
| 4,480,439 | A | | 11/1984 | Yamane |
| 4,698,728 | A | | 10/1987 | Tustaniwskyj et al. |
| 4,721,996 | A | | 1/1988 | Tustaniwskyj et al. |
| 4,730,666 | A | | 3/1988 | Flint et al. |
| 4,753,268 | A | * | 6/1988 | Palau ............................ 137/595 |

(Continued)

*Primary Examiner* — Erick Keasel
*Assistant Examiner* — David Colon Morales
(74) *Attorney, Agent, or Firm* — Manuel de la Cerra (57) ABSTRACT

A connector for use in a negative pressure coolant system is disclosed. The connector connects coolant system circulating to an electrical component thereby allowing the coolant to circulate through the electrical component. The connector is made up of two components, a component side connector and a pump side connector, and can be in three positions: disengaged, semi-engaged and fully-engaged. An electrical component can be drained of its coolant while the connector is shifted from the fully-engaged position, to the semi-engaged position and to the disengaged position. This can be accomplished without shutting down the negative pressure coolant system, thus allowing a particular electrical component to be disconnected without affecting the cooling efficiency of other electrical components connected to the system. Because the coolant is drained, it will not spill on the electrical component and cause damage.

28 Claims, 12 Drawing Sheets

(56) References Cited

U.S. PATENT DOCUMENTS

| | | | |
|---|---|---|---|
| 4,967,832 A | 11/1990 | Porter | |
| 4,993,485 A | 2/1991 | Gorman | |
| 5,048,599 A | 9/1991 | Tustaniwskyj et al. | |
| 5,172,723 A * | 12/1992 | Sturgis | 137/613 |
| 5,203,401 A | 4/1993 | Hamburgen et al. | |
| 5,211,638 A | 5/1993 | Dudar et al. | |
| 5,226,471 A | 7/1993 | Stefani | |
| 5,251,661 A * | 10/1993 | Hugues et al. | 137/637.1 |
| 5,269,763 A * | 12/1993 | Boehmer et al. | 604/167.04 |
| 5,323,808 A * | 6/1994 | Shimizu | 137/594 |
| 5,383,492 A * | 1/1995 | Segal | 137/614.06 |
| 5,406,807 A | 4/1995 | Ashiwake et al. | |
| 5,431,641 A * | 7/1995 | Grozinger et al. | 604/533 |
| 5,464,042 A * | 11/1995 | Haunhorst | 137/595 |
| 5,473,508 A | 12/1995 | Porter et al. | |
| 5,542,412 A * | 8/1996 | Century | 128/203.15 |
| 5,887,619 A | 3/1999 | Keary | |
| 5,988,216 A * | 11/1999 | Schumacher | 137/614.05 |
| 6,062,244 A * | 5/2000 | Arkans | 137/1 |
| 6,161,578 A | 12/2000 | Braun et al. | |
| 6,237,633 B1 * | 5/2001 | Nimberger | 137/614.2 |
| 6,371,157 B1 | 4/2002 | See et al. | |
| 6,481,756 B1 * | 11/2002 | Field et al. | 285/124.1 |
| 6,547,284 B2 * | 4/2003 | Rose et al. | 285/1 |
| 6,615,911 B1 | 9/2003 | Bhatti et al. | |
| 6,655,449 B1 | 12/2003 | Hsien | |
| 6,760,221 B2 | 7/2004 | Goth et al. | |
| 6,924,981 B2 | 8/2005 | Chu et al. | |
| 7,044,155 B2 * | 5/2006 | Zanolin et al. | 137/340 |
| 7,149,084 B2 | 12/2006 | Matsushima et al. | |
| 7,191,798 B2 * | 3/2007 | Edelman et al. | 137/614.04 |
| 7,254,957 B2 | 8/2007 | Weber et al. | |
| 7,310,230 B2 | 12/2007 | Tustaniwskyi et al. | |
| 7,323,004 B2 * | 1/2008 | Parihar | 606/213 |
| 7,380,409 B2 * | 6/2008 | Campbell et al. | 62/259.2 |
| 7,508,665 B1 | 3/2009 | Palmer | |
| 7,963,119 B2 | 6/2011 | Campbell et al. | |
| 8,021,353 B2 * | 9/2011 | Andersen et al. | 604/533 |
| 2006/0011326 A1 | 1/2006 | Yuval | |
| 2007/0000648 A1 | 1/2007 | Crocker et al. | |
| 2007/0039719 A1 | 2/2007 | Eriksen | |
| 2007/0235170 A1 | 10/2007 | Zinck et al. | |
| 2008/0055846 A1 | 3/2008 | Clidaras et al. | |
| 2008/0110938 A1 * | 5/2008 | Sternberg | 222/494 |
| 2008/0259566 A1 | 10/2008 | Fried | |
| 2009/0306833 A1 | 12/2009 | Vinson et al. | |
| 2011/0240281 A1 * | 10/2011 | Avery | 165/287 |
| 2011/0253347 A1 * | 10/2011 | Harrington | 165/104.31 |
| 2012/0125448 A1 * | 5/2012 | Chen et al. | 137/315.01 |
| 2012/0126527 A1 * | 5/2012 | Chen et al. | 285/30 |
| 2012/0180979 A1 * | 7/2012 | Harrington | 165/11.1 |
| 2013/0134702 A1 * | 5/2013 | Boraas et al. | 285/124.1 |

* cited by examiner

NO DRIP HOT SWAP CONNECTOR AND METHOD OF USE

1.0 CLAIM OF PRIORITY

The present application claims priority as a non-provisional of Ser. No. 61/839,246 filed on Jun. 25, 2013. The full disclosure of this reference is herein incorporated by reference.

2.0 TECHNICAL FIELD

The present invention relates to systems and methods for cooling computer systems.

3.0 BACKGROUND

Arrays of electronic computers or components, such as those found in data centers, generate a great deal of heat. An example central processing unit of a personal computer ("CPU") generates over 100 watts of heat (some can generate much more than this) and has a maximum case temperature of about 60 C. An example array (or rack) of 88 CPUs may generate 9 kW of heat.

The standard way to keep data centers cool is to use expensive and relatively inefficient vapor-compression refrigeration systems at least part of the time. These conventional cooling or "air conditioning" systems often use more power that the computers themselves, all of which is discharged to the environment as waste heat. These systems use air as the heat transfer medium, and it is due to the low heat capacity and low thermal conductivity of air that refrigeration must be used to remove the heat generated by multiple air heat exchangers. Some operators use evaporation of cooling liquid to cool liquid-to-air heat exchangers. While this is more thermally efficient than refrigeration, the computers run hotter, reducing their reliability, decreasing their efficiency and making the data center uncomfortable for human occupants.

Water is used as the coolant throughout this disclosure, but it will be known to those in art that other coolants may be used. Water has approximately 4000 times more heat capacity than air of the same volume, so water is a theoretically ideal heat transfer agent for direct heat transfer from heat generating components. Other coolants offer similar performance. For example, the coolant may consist essentially of water, including tap water, or may comprise one or more perfluorocarbons or avionics cooling liquids. Liquid cooling is recognized as a thermally efficient way to cool computer CPUs due to their high concentration of power and heat generation in a small space, but the rest of a computer's electronics generate heat at a lower rate and temperature, so air-cooling is appropriate for much of the associated hardware.

Current systems may use liquid cooling to move the heat from the CPU to a radiator mounted close to the CPU, or they may use an air-to-liquid heat exchanger to remove heat from the computer enclosure. These systems suffer from the high thermal resistance and bulkiness of air-to-liquid or liquid-to-air heat exchangers. Other systems use a chilled coolant loop to cool the computer, but these systems require complex and expensive connectors and plumbing to connect the server to the building coolant supply while insuring that no leaks occur, which may be devastating in or near a computer. Accordingly, operators of server systems are rightly concerned about leaks and reliability of using liquid to cool computers. Furthermore, chillers require a large amount of power. Additionally, for operation in a data center, servers, particularly blade servers, need to be compact.

Therefore, what is needed is a compact cooling solution adaptable for up to a large number of computers, that combines and balances air-cooling for low-intensity heat sources with liquid-cooling for high-intensity heat sources while using a minimum amount of coolant flow, and that is reliable, leak-free and low in power consumption.

4.0 SUMMARY

The present system addresses these issues and more by providing in various example embodiments an efficient and compact connector for use in a negative pressure coolant system. The connector connects the coolant system to an electrical component thereby allowing the coolant to circulate through the electrical component. The connector is made up of two components, a component side connector and a pump side connector. The component side connector includes a housing that contains a return conduit pin and a supply conduit pin that are both in hydraulic connection with the electrical component allowing coolant to circulate through the electrical component. The pump side connector mates with component side connector. The pump side connector includes a housing that contains a return valve and a supply valve. The return and supply valves are constructed such that the connector has three positions: disengaged, semi-engaged and fully-engaged. When the pump side connector is in a disengaged position both the return and supply valves are closed and sealed against positive pressure. When the pump side connector is in a semi-engaged position with the component side connector (1) the return valve forms a hydraulic seal with the return conduit pin, (2) the supply conduit pin is hydraulically exposed to positive pressure, and (3) the supply valve is closed and sealed against positive pressure. And when the pump side connector is in a fully-engaged position with the component side connector (1) the return valve forms a hydraulic seal with the return conduit pin, and (2) the supply valve forms a hydraulic seal with the supply conduit pin, thereby allowing the coolant to circulate to the electrical component.

Other aspects of the invention are disclosed herein as discussed in the following Drawings and Detailed Description.

5.0 BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. It will be understood that certain components and details may not appear in the figures to assist in more clearly describing the invention.

6.0 DETAILED DESCRIPTION

Following is a non-limiting written description of example embodiments illustrating various aspects of the invention. These examples are provided to enable a person of ordinary skill in the art to practice the full scope of the invention without having to engage in an undue amount of experimentation. As will be apparent to persons skilled in the art, further modifications and adaptations can be made without departing from the spirit and scope of the invention, which is limited only by the claims.

Figure 11:
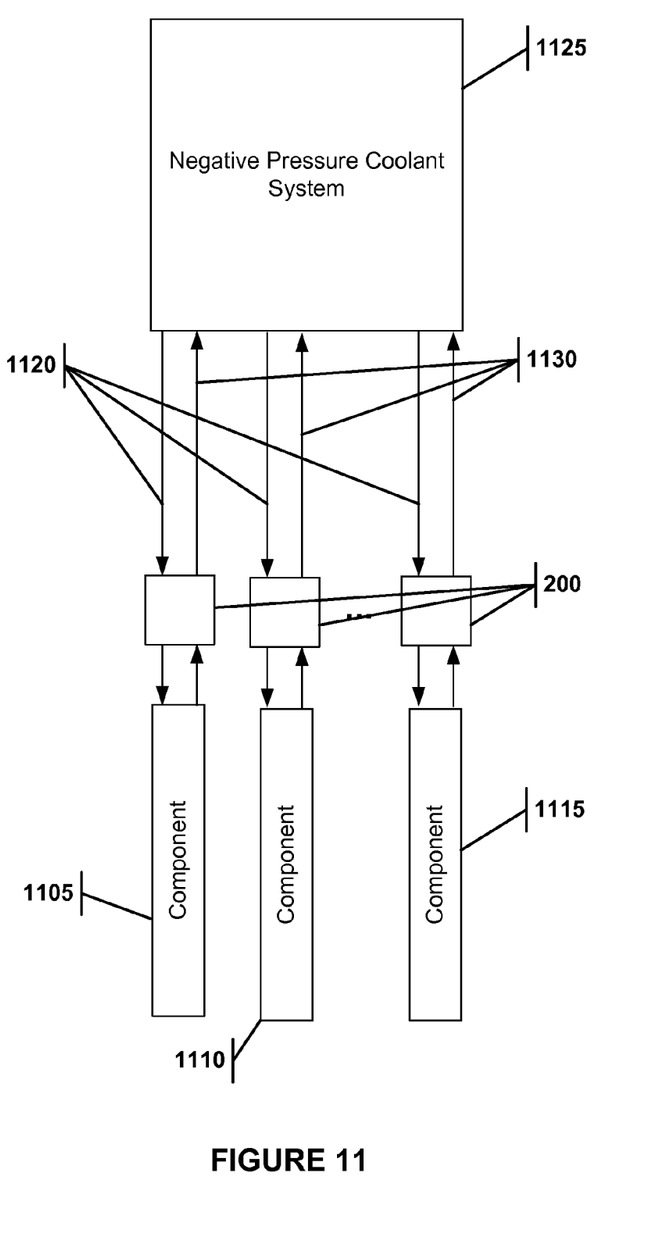
FIG. 11 illustrates the use of the connector in a negative pressure coolant pumping system.

As shown in FIG. 11, liquid cooled electronic components 1105, 1110 and 1115 receive coolant via lines 1120 from the central negative pressure coolant pumping system 1125, the coolant then passes through a heat exchanger in the components and returns to the central negative pressure coolant pumping system 1120 via lines 1130. The central negative pressure coolant pumping system 1125 may contain several subcomponents such as pumps, reservoirs and valves. For example, one such system is described in patent application Ser. No. 13/410,558 "Computer Cooling System and Method of Use" filed Mar. 2, 2012 by the same inventor, which is incorporated herein by reference in its entirety.

When a component needs to be disconnected it should be drained of coolant to allow for component removal without spilling coolant on sensitive electronics and to prevent freezing damage, corrosion and bacterial growth. An object of this disclosure is to allow for a liquid cooled electronic component to be drained of coolant upon disconnection from a negative pressure pumped liquid cooling system and to seal the pumping system with minimal effort.

The connector disclosed herein compels the user to remove substantially all the coolant in the component before disconnecting it from the pumping system. The inventor of this application has disclosed designs for no drip hot swap connector in patent application Ser. No. 13/410,558 "Computer Cooling System and Method of Use" filed Mar. 2, 2012 by the same inventor, which is incorporated herein by reference in its entirety. The present application includes improvements to the earlier patent application such as preventing the user from removing the connector in one motion and using a staggered multi-valve.

The connector 200, comprised of two components described below, is connected on one side to the component (1105, 1110, 1115) and on the other side to the negative pressure coolant pumping system 1125. The user must pull the connector from a fully-engaged position to a semi-engaged position in order to reveal a latch, in such a position only one conduit pin is inserted into a valve while the other conduit pin is exposed to positive pressure causing the coolant in the component to be sucked into the pumping system and thereby removed from the component. It should be noted that exposure of the connector to any positive pressure relative to the pressure in the central negative pressure coolant pumping system would cause the component to drain its coolant; this includes normal ambient or atmospheric pressure. The user can then complete the disconnection of the connecter by depressing the latch, allowing the connector to be fully removed.

All of this can happen without turning off or otherwise affecting the rest of the coolant system. In a typical coolant flow rate of 500 cc/minute, the component may contain approximately 8 cc of coolant, so the component is drained in less than one second. Thus the connector disclosed herein is also known as a no drip hot swap connector.

6.1 The Return Valve and Supply Valve

The preferred embodiment of the no drip hot swap connector consists of two flexible valves, each of which may seal against a conduit pin or positive pressure. The valves are positioned so that one opens before the other as the male portion of the connector (the component side) is advanced into or removed from the female portion (the pumping side).

Figure 1A:
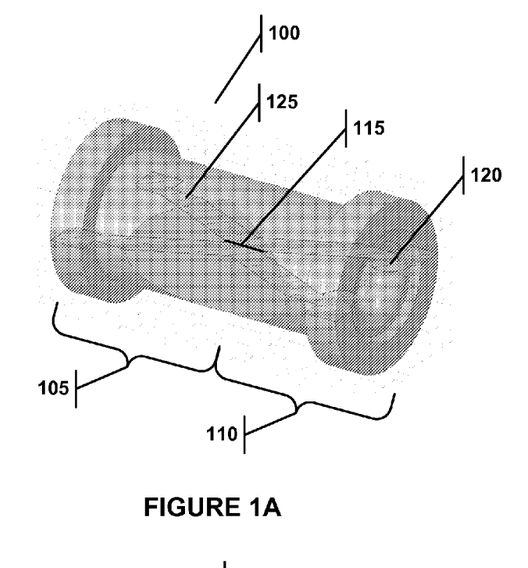
FIG. 1A illustrates a duckbill valve.

One embodiment of the valve 100 is shown in FIG. 1A. The valve is similar to the double duckbill type of check valve, which is well known in the art. There are two duckbill valves (105 and 110) mirrored and connected together, with a slit in the center 115 of the valve that seals when either end of the valve is connected to a pressure lower than that of the pressure surrounding the outside of the valve—i.e., the ambient pressure. There is also a circular seal 120 around one end of the valve which may seal around a conduit pin. The conduit pin is similar to the inflation needles which are used to fill up basketballs etc. with air. It has a rounded tip and at least one hole or port in the side for flow. The hole or port may be positioned so that it is facing upwards so that any droplets of coolant will not fall out. The diameter of the hole/port may be adjusted to prevent coolant from escaping under positive pressure. Also, multiple small diameter holes/ports may be used to allow for the full and efficient coolant circulation when the connector is fully-engaged, but when the connector is disengaged and exposed to positive pressure, the coolant's surface tension would prevent the coolant from leaking out of the smaller diameter holes/ports.

Also shown in FIG. 1A in cross-hatch 125 is the thickness of the walls of the valve 100 along with their general shape.

Figure 1B:
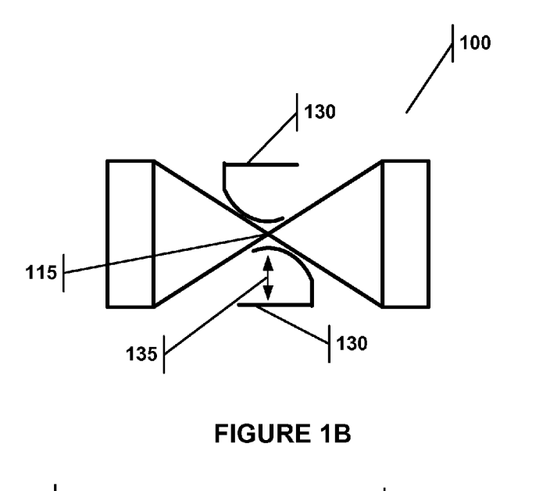
FIG. 1B illustrates the top view of the duckbill valve of FIG. 1A.

FIG. 1B illustrates a top view of the valve 100, with the slit 115. Two additional and optional compliant structures 130 are shown, which are made of a compliant material such that they can exert force on the valve 100. The compliant structures can be compressed in the direction of arrow 135 when the conduit pin is inserted into the valve 100 (described below). Once the conduit pin is removed from the valve 100, the compliant structures resume their pre-compressed shape and exert force on the walls of the valve 100, thus shutting the valve and preventing air from entering the system. These compliant structures 130 may not be necessary to the design because the resilient nature of the valve 100 (and its material) would be sufficient to seal against positive pressure.

Figure 1C:
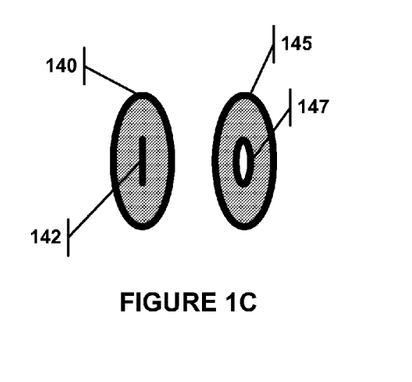
FIG. 1C illustrates an alternate two-disk valve design.

In another embodiment, the valve may be formed of two disks of a resilient material, such as plastic, silicone or rubber, as shown in FIG. 1C. One disk 140 contains a slit 142 in the middle and the second disk 145 has a circle 147 bored out. Disk 140 operates in the same manner as the slit 115 in the center of valve 100 of FIG. 1A. And disk 145 operates in the same manner as the circular seal 120 of the valve 100 of FIG. 1A. These discs may be contained within a rigid housing, similar to a Pete's Plug, as described in U.S. Pat. No. 3,797, 317. The disks 140, 145 can be placed into the rigid housing in a compressed state, such that upon removal of the conduit pin, the slit disk 140 closes completely. While these structures 140, 145 are described as "disks", it would be apparent that other shapes could be used such as, but not limited to, a rectilinear shape.

Figure 1D:
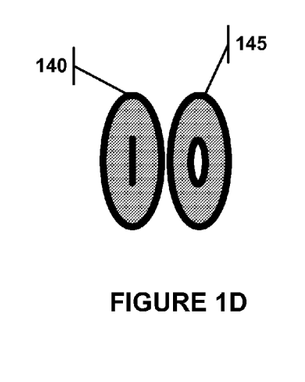
FIG. 1D illustrates one way to stage the valve design of FIG. 1C.
Figure 1E:
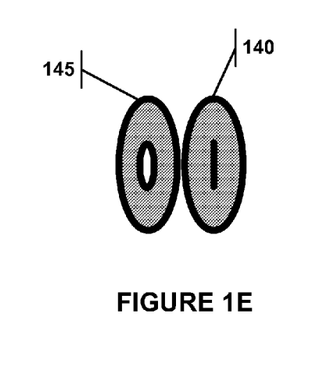
FIG. 1E illustrates a second way to stage the valve design of FIG. 1C.

As described below, the connector uses two valves in a staggered design and at an orientation that is 180 degrees from each other. So the connector with the duckbill valve 100 of FIG. 1A would use two such valves in a staggered configuration, with one valve 100 (the return valve) having the circular seal 120 that contacts a return conduit pin at the entrance of the valve 100 and a second valve 100 (the supply valve) having the circular seal 120 contacting a supply conduit pin at the exit of the valve 100. And for the connector with the disk valve of FIG. 1C, the supply valve would have the slit disk 140 first and the hole disk 145 second, as shown in FIG. 1D, while the return valve would have the reverse order (FIG. 1E). The valve construction of FIGS. 1C through 1E might be more compact. The descriptions below describe the connector with the duckbill type valve (i.e., FIG. 1A), but it should be understood that other valve designs are possible provided they provide a sealed connection.

6.2 The No Drip Hot Swap Connector

Figure 2A:
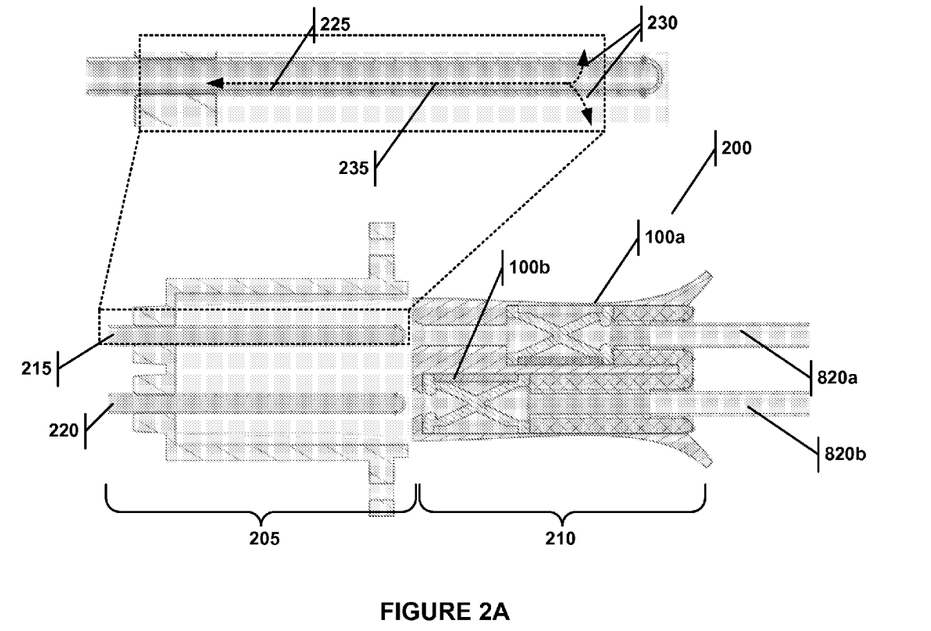
FIG. 2A illustrates the connector and its two components in the disengaged position.

The entire connector 200 is shown in FIG. 2A. The connector is made up of two detachable components, the electronic component side 205 (male side) is on the left and the pumping side 210 (female side) is on the right. The connector is comprised of two double-duck-bill valves 100a, 100b described above with regards to FIG. 1A, although other valve designs are also possible, including the design described in FIG. 1C. Each of these valves 100a, 100b is sealed by the force of the positive (which may include ambient) air pressure on the external surface of the valve, which keeps the slit shut.

Valve 100a is the supply valve that supplies coolant to the component, while valve 100b is the return valve that allows coolant that has circulated through the component to return to the negative pressure pumping system. It is into each of the valves 100a, 100b that conduit pins 215, 220 are inserted. Again, these conduit pins or cannulae are analogous to the inflation needles which are used to fill up basketball—that is they have a central channel/conduit 225 connected to a port or ports 230 at the distal end, allowing for coolant to either enter or exit the pin as depicted by arrow 235.

The connector has three possible engagement positions: disengaged, semi-engaged and fully engaged. FIG. 2A illustrates the disengaged position where the conduit pins 215 and 220 have not engaged their respective valves. In this position, the valves 100a and 100b are completely sealed from positive pressure on the external surface of the valve. Therefore, air cannot be sucked into the negative pressure pumping system.

Conduit pins 215 and 220 do not engage their respective valves at the same time. Rather as the component side 205 is brought into mating contact with the pumping side 210, return conduit pin 220 engages the return valve 100b first thus forming a sealed hydraulic connection between the return connector tube 820b and the conduit within return conduit pin 220. Once that connection is made, called the semi-engaged position, the pumping system which is at negative pressure begins to suck air from the supply conduit pin 215. The semi-engaged position is described in more detail below with reference to FIGS. 4A, 4B and 4C.

Figure 2B:
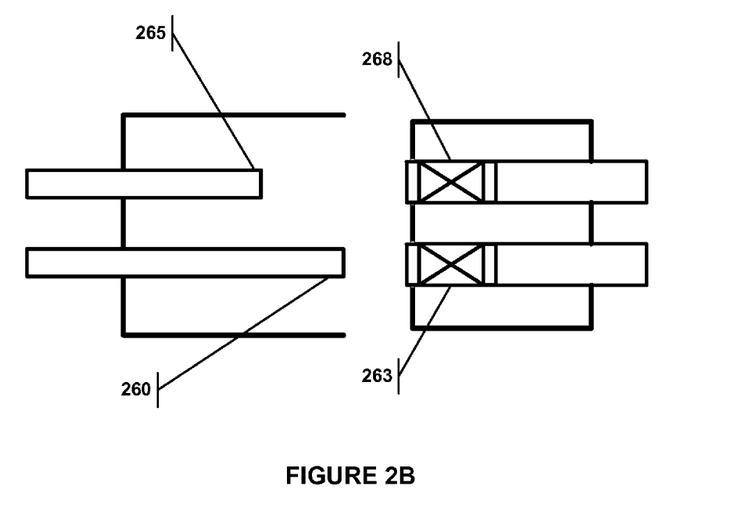
FIG. 2B illustrates another configuration of the connector with staggered conduit pin lengths.

After the semi-engaged position, the component side 205 is brought closer to the pumping side 210 such that the supply conduit pin 215 engages the supply valve 100a, forming a sealed hydraulic connection between the supply connector tube 820a and the conduit within supply conduit pin 215. When both conduit pins are engaged, the connector is in the fully-engaged position such that coolant from the pumping system can flow through the component. The fully-engaged position is described in more detail below with reference to FIG. 3. While the valves are shown in a staggered configuration, the conduit pins can instead be staggered, with the same result—i.e., the valves engage their respective conduit pins in a staggered/serial manner. This is shown in FIG. 2B, where the conduit pins are staggered with the return conduit pin 260 positioned to engage with the return valve 263 before the supply conduit pin 265 engages with the supply valve 268.

The portion of the return valve 100b that seals against the return conduit pin 220 is on the left and on the right for supply conduit pin 215/supply valve 100a complex. This maximizes the range of the connector insertion position wherein the server may be drained.

6.3 The Fully-Engaged (Pumping) Position

Figure 3:
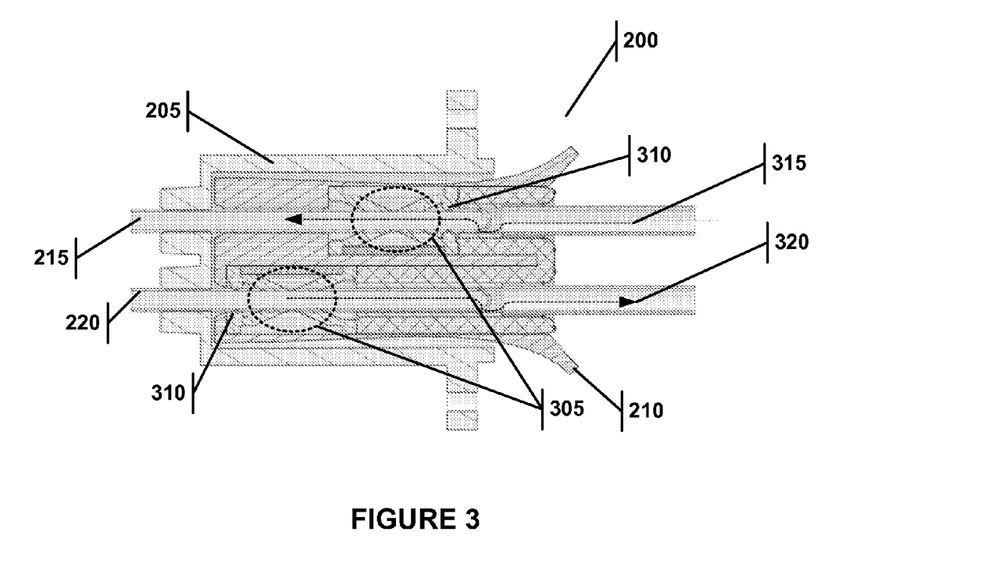
FIG. 3 illustrates the connector of FIG. 2A in a fully-engaged position.

The connector 200 in the fully-engaged or pumping position is shown in FIG. 3. The component side 205 has been mated with the pumping side 210 such that the conduit pins (215 and 220) force the slits open on valves 100a, 100b as shown in highlighted areas 305, so that coolant may flow through the connector. The circular seals around either end of the valves (shown at position 310) prevent air from leaking into the system. The flow in the top is from right to left (shown with arrow 315), thus supplying coolant into the component side 205 and in the bottom it is from left to right (shown with arrow 320), thus removing coolant from the component side 205. The valves should be tight against the housing so as to provide a tight seal and prevent air from entraining into the coolant system.

6.4 The Semi-Engaged (Draining) Position

Figure 4A:
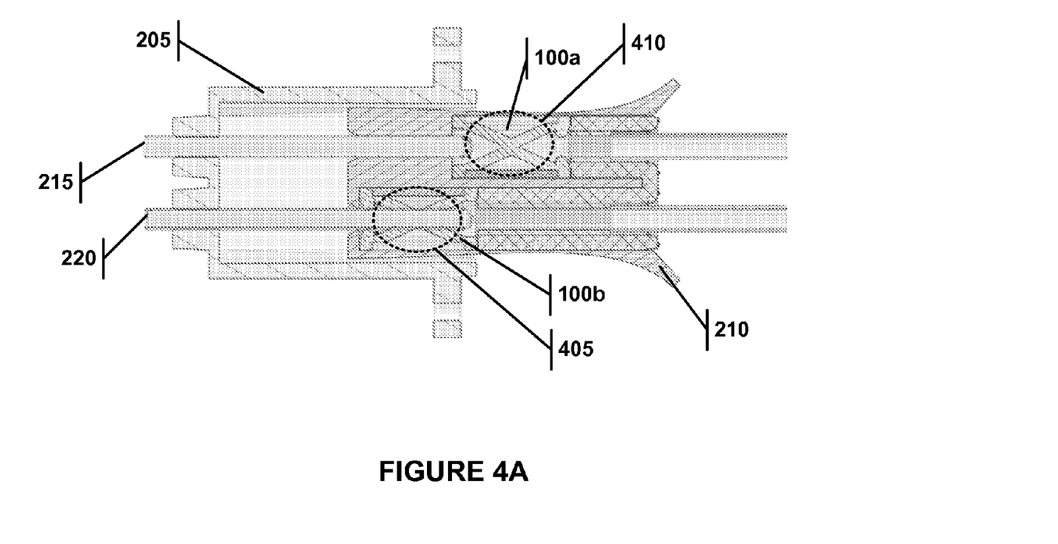
FIG. 4A illustrates the connector of FIG. 2A in a semi-engaged position.

The connector in the semi-engaged or draining position is shown in FIG. 4A. In this position, the component side 205 is pulled to the left away from the pumping side 210. The important thing to note in this figure is that the return conduit pin 220 is stilled engaged with the return valve 100b as shown in highlighted area 405. This return conduit pin 220 represents the flow from the component to the pumping system, while the supply conduit pin 215 is not engaged (highlight area 410) and the supply valve 100a is sealed. The holes in the side of the supply conduit pin 215 allow air to flow into pin 215, thereby clearing the coolant out of the component, as shown in FIG. 4B.

Figure 4B:
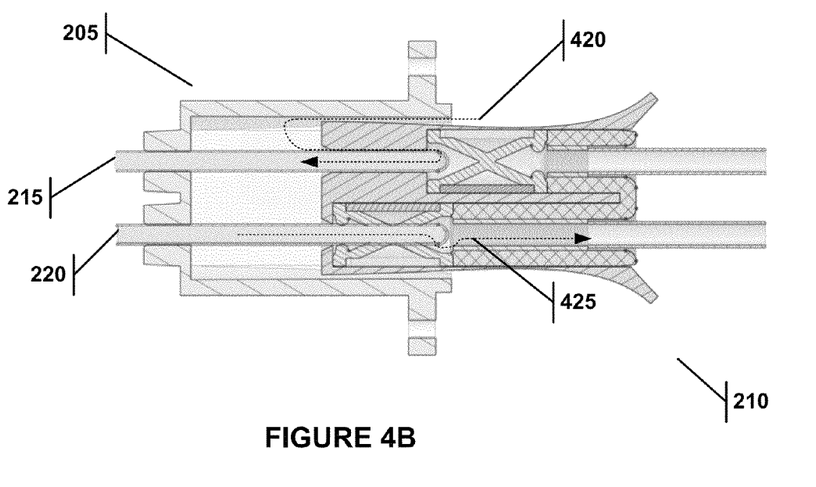
FIG. 4B illustrates the connector of FIG. 2A in a semi-engaged position, further showing the air flow.

FIG. 4B illustrates the flow of air into the component side of the system so as to drain the coolant from the component side, thus allowing for a no-drip disconnection when the cooling system is operating. In other words, a user can disconnect the component side from the pumping side without having to turn off the cooling system. This is important because a central liquid cooling system often services several dozen individual electronic components. It is simply not feasible to shut down the cooling system when a single one of those components must be taken off-line for repair or replacement because such a shutdown would subject the other components to potential heat damage. It is also important that the system purges itself automatically when disconnected to prevent the coolant from splashing on the electronic component and causing damage. Because the component is drained, once it is removed a user can trouble shoot the component without concern of coolant spilling and causing damage.

FIG. 4B shows the airflow 420 into the supply conduit pin 215. The construction of the component side 205 and the pumping side 210 should allow for air-flow into the component side when the connector is in the semi-engaged position (i.e., the position shown in FIGS. 4A, 4B and 4C). Because the return conduit pin 220 is still fully engaged with the pumping side, coolant is still being sucked into the pumping side as shown by coolant flow 425. Within a moment, the component side will be drained of most of its coolant, thus preventing the coolant from causing damage to the electronic component. In a preferred embodiment, the coolant flow rate is 500 cc/minute, and the component contains approximately 8 cc of coolant, so the component is drained in less than one second.

Figure 4C:
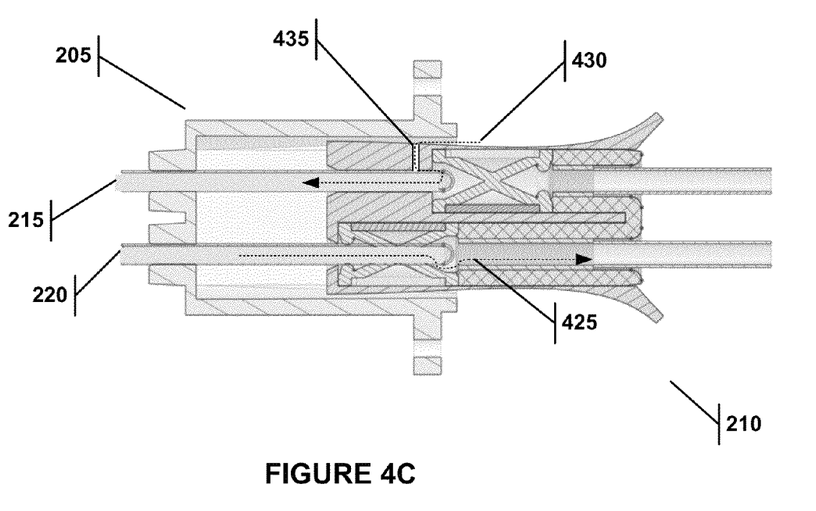
FIG. 4C illustrates the connector of FIG. 2A in a semi-engaged position, further showing the air flow through a whistle.

FIG. 4C shows another embodiment of the connector which includes a whistle 435. The whistle 435 may make a noise when airflow 430 rushes through or past it. The amount of air flow 430 will change depending on the amount of coolant left in the electronic component. When the electronic component is drained the air flow 430 will increase, and it is the difference in the airflow that can cause a change in the audible characteristic of the whistle indicating to a user that the component has been sufficiently drained.

6.5 Delay Structures

Figure 5:
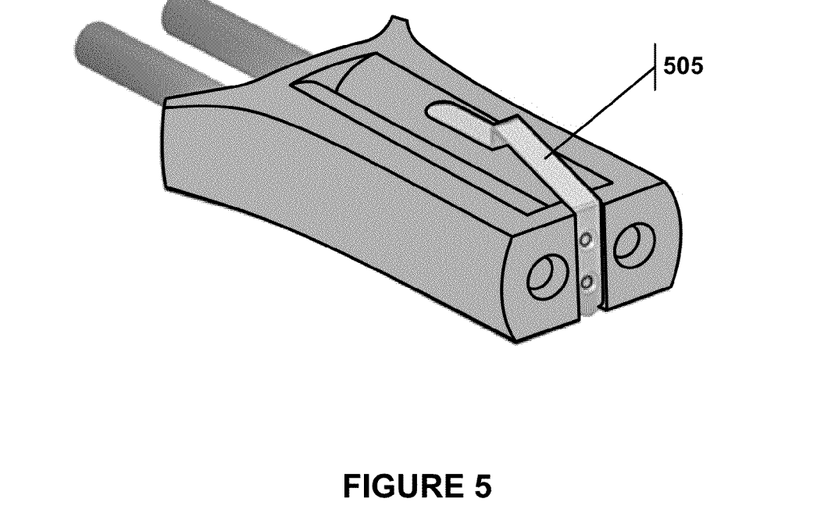
FIG. 5 illustrates the pumping side of the connector with a latch.

If the connector is separated too quickly, the coolant may not completely drained from the component, therefore it is preferable to have a latch system that forces the user to maintain the connector in the semi-engaged position shown in FIGS. 4A, 4B and 4C for a moment prior to complete disconnection of the connector. FIG. 5 illustrates a latch 505 on the pumping side 210 of the connector that assists in momentarily keeping the connector in the semi-engaged position. This latch 505 mates with the complementary structure 605 shown in FIG. 6 which holds the connector in the semi-engaged position. This is the position shown in FIG. 6. The rounded end of the latch 505 is not able to be actuated until the pumping side 210 is partially separated from the component side 205. In a typical removal, the user will initially pull on the sides of the connector bringing the latch to the position shown in FIG. 6, then the user will repositioned their hand to depress the latch allowing the connector to be completely disconnected. This two-step process keeps the connector in the semi-engaged position momentarily to allow complete draining of the coolant from the component. Other suitable designs may be employed to affect a delay to allow the connector to remain in the semi-engaged position long enough to allow for complete draining of the coolant from the component.

Figure 6:
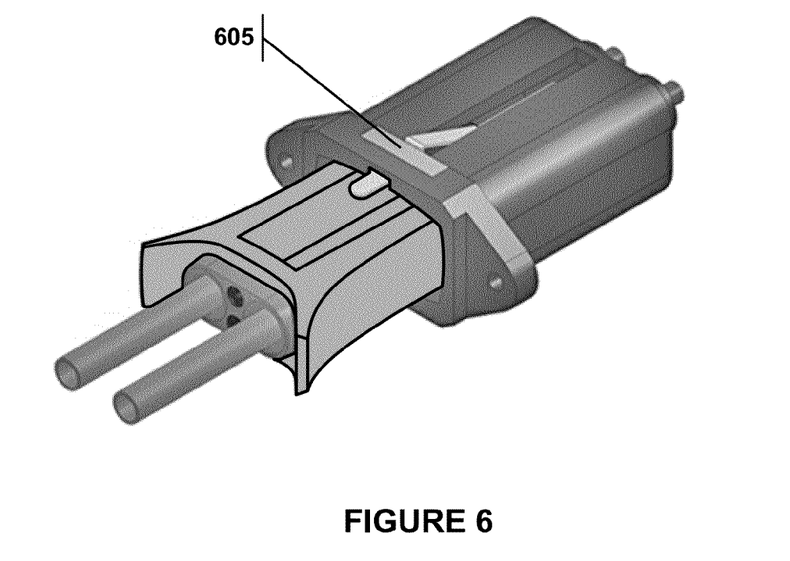
FIG. 6 illustrates the pumping side of the connector inserted into the component side of the connector, with the latch engaged.
Figure 7:
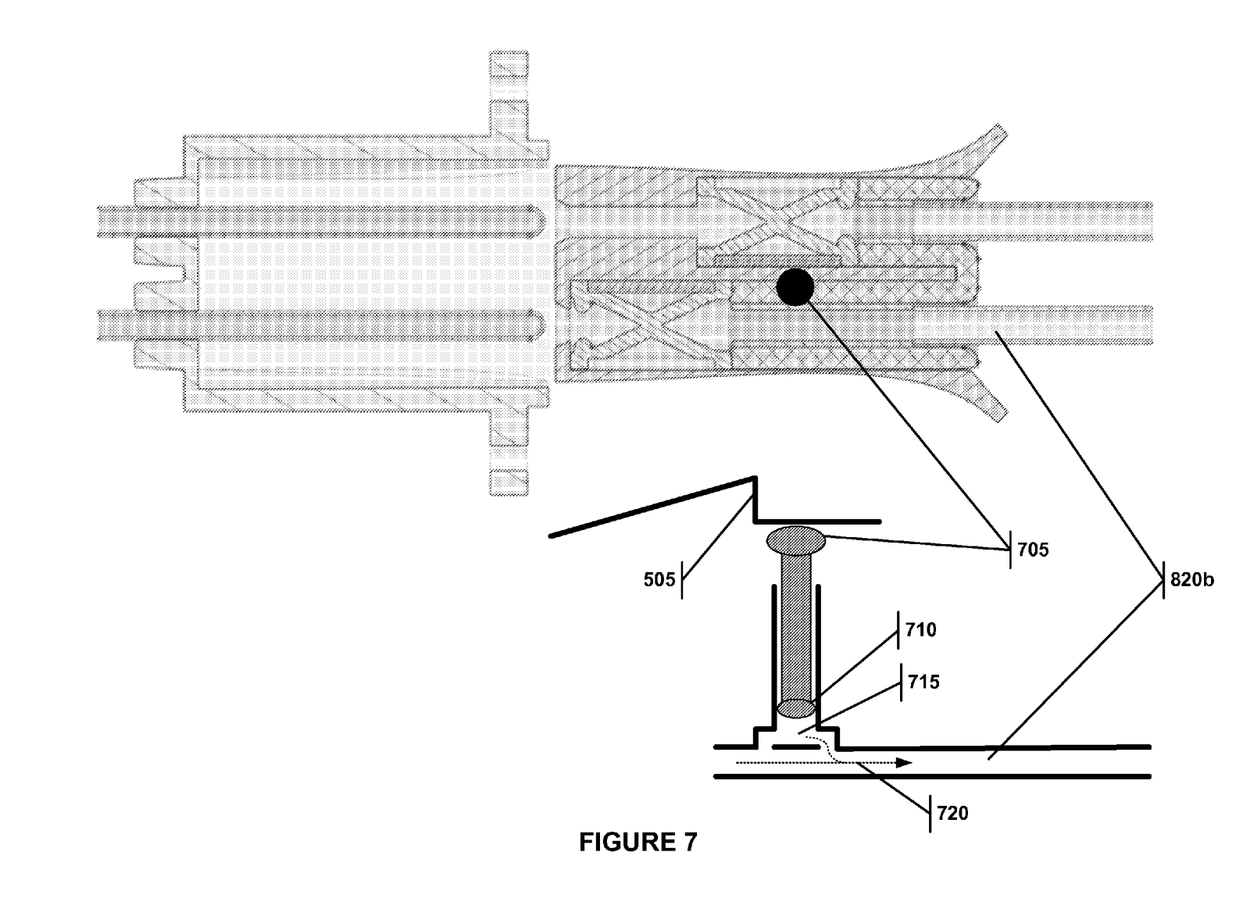
FIG. 7 illustrates a hydraulic delay mechanism in the connector.

In another embodiment from co-pending application Ser. No. 13/410,558, the coolant may itself create the delay. For example, the connector may include a coolant delay mechanism such as shown in FIG. 7, which prevents the user from disconnecting the connector until the component side is purged of coolant. The connector may achieve this in a two-step process. First, the user will initially pull on the sides of the connector bringing the latch to the position shown in FIG. 6, then the user will depress the latch allowing the connector to be completely disconnected. It is in the second step that the coolant itself can create a delay. The latch 505 is connected to a button 705. At the bottom of the button is a piston head 710 or plunger that resists movement by a hydraulic lock created by coolant still present in the bottom chamber 715, which coolant will take a short period of time to be sucked out. The leak rate from bottom chamber 715 is selected such that the piston head 710 does not move until enough time has passed to ensure that the component side has been purged of coolant as shown by arrow 720 through connector tube 820b. Once the button is free to move, the user can depress the latch and complete the disconnection. Thus, the valve is a mechanical device that creates a delay in releasing the connection, during which time the coolant can be drained. When the system is dry, no delay occurs because there is no coolant to be pushed out of the bottom chamber 715 by the piston head 710, so the delay does not happen when it is not needed.

6.6 Keyed Configuration

The latch 505 on the pumping side 205 and the complementary slot 605 on the component side 210 create a keyed configuration such that the two components of the connector can only mate in one orientation. A keyed configuration, however, may not be necessary to the operation of the connector. If, for example, coolant can flow through the component in either direction without affecting cooling efficiency then the two components of the connector can be connected in either orientation. If, however, the cooling efficiency is dependent on the flow direction, the two components should be keyed. This may be the case, for example, if the component, or connector, has a coolant filter such that changing the coolant flow direction would backwash that filter and pollute the system.

If instead of a staggered valve configuration, the conduit pins are staggered then it would be preferable to have a keyed configuration to ensure that the first conduit pin to engage, engages with the return valve.

6.7 The Subcomponents of the Connector

Figure 8:
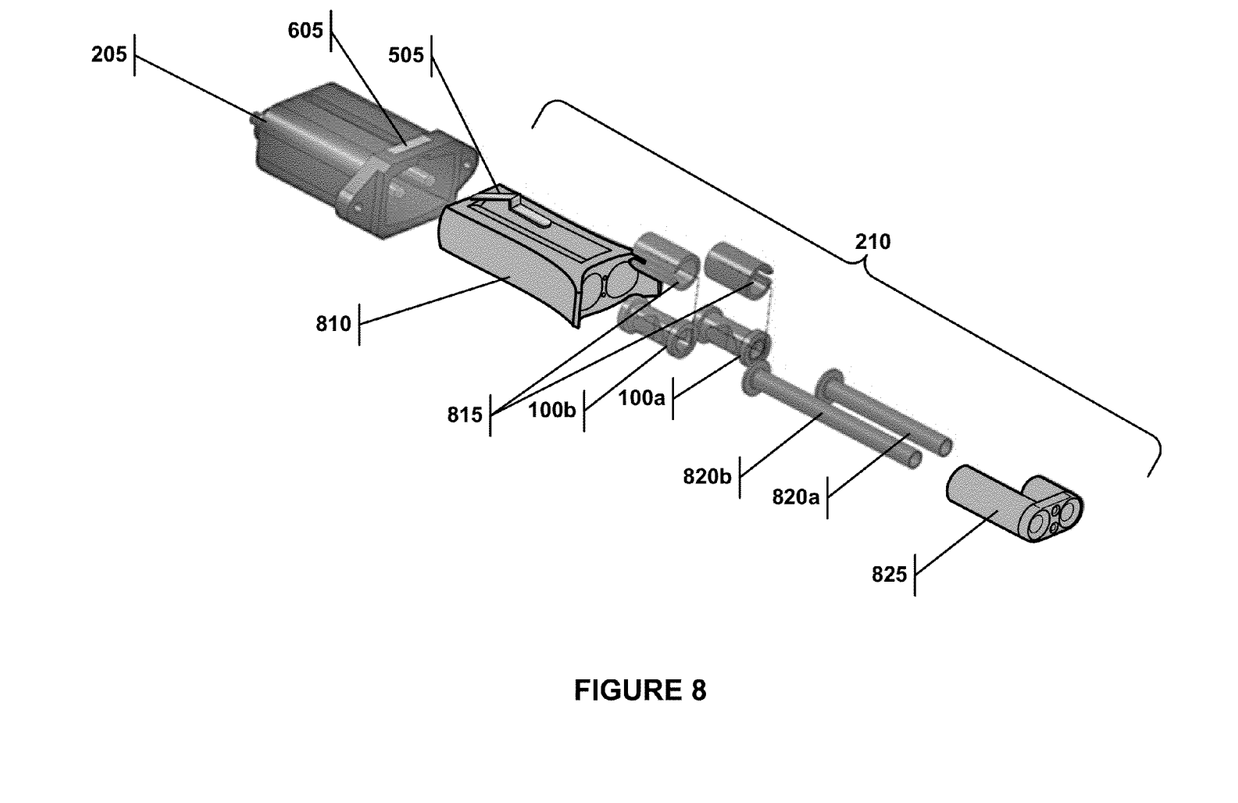
FIG. 8 is an isometric and exploded view of the connector of FIG. 6.
Figure 9:
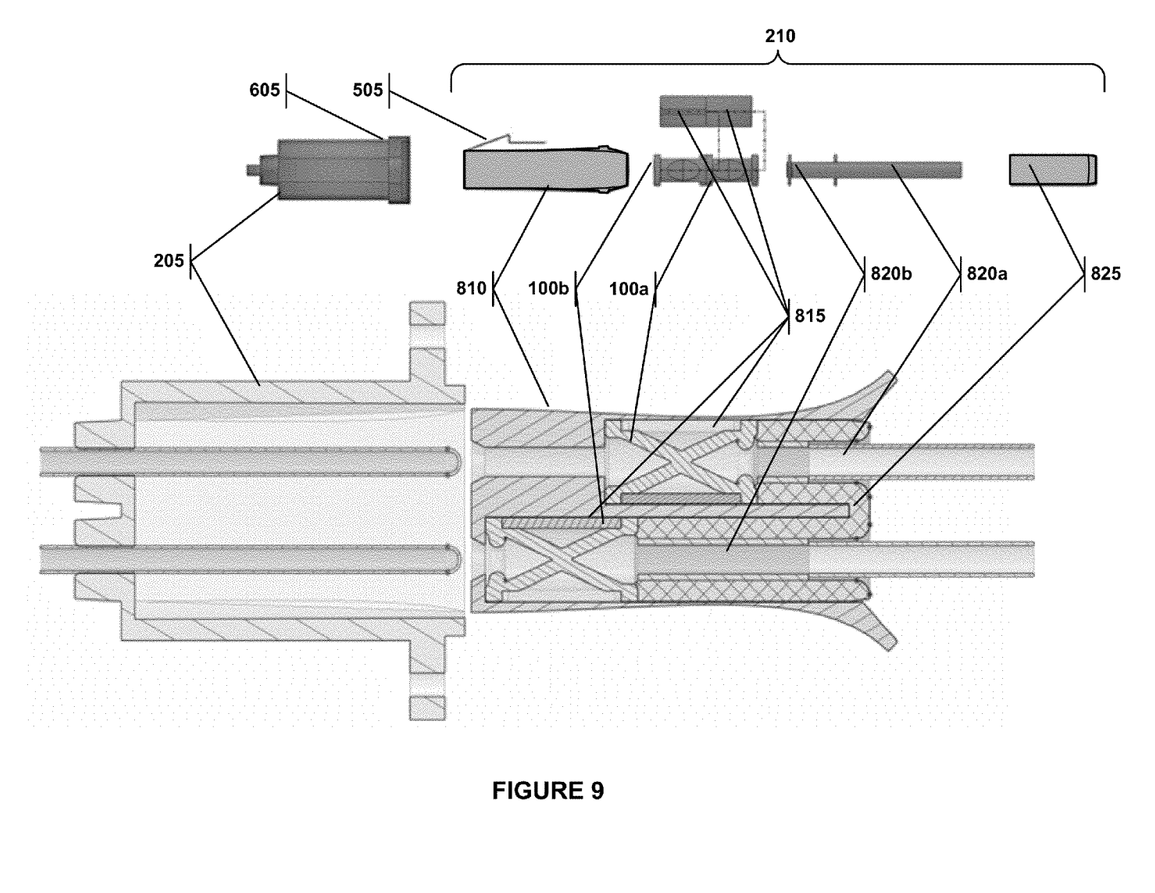
FIG. 9 is a side and exploded view of the connector of FIG. 6, along with a top view.

FIGS. 8 and 9 illustrate an exploded view of the connector, with all its various subcomponents. The pumping side 210 of the connector has several subcomponents including supply valve 100a, return valve 100b, which are enclosed by retaining clips 815. These clips 815 may apply compressive force to the valves 100a, 100b assisting in closing the valves when the valves are not engaged with a conduit pin, and also provide structural support to prevent the valves from deforming too much when the associated conduit pin is inserted or removed. Connector tubes 820a, 820b butts up against the valves 100a, 100b creating an airtight seal. The tubes 820a, 820b may be rigid such that flexible tubing can be affixed to it on the outside of the connector. Rubber gasket 825 fits over the tubes 820a, 820b and also butts up against the valves 100a, 100b, further assisting in an airtight seal. All of these components snugly fit within the housing 810 of the pumping side 210 of the connector. On the top side of the housing 810 is a latch 505 that mates with a complementary structure 605 on the component side 205 connector.

6.8 Blind Mate Connection Using the Connector

Figure 10A:
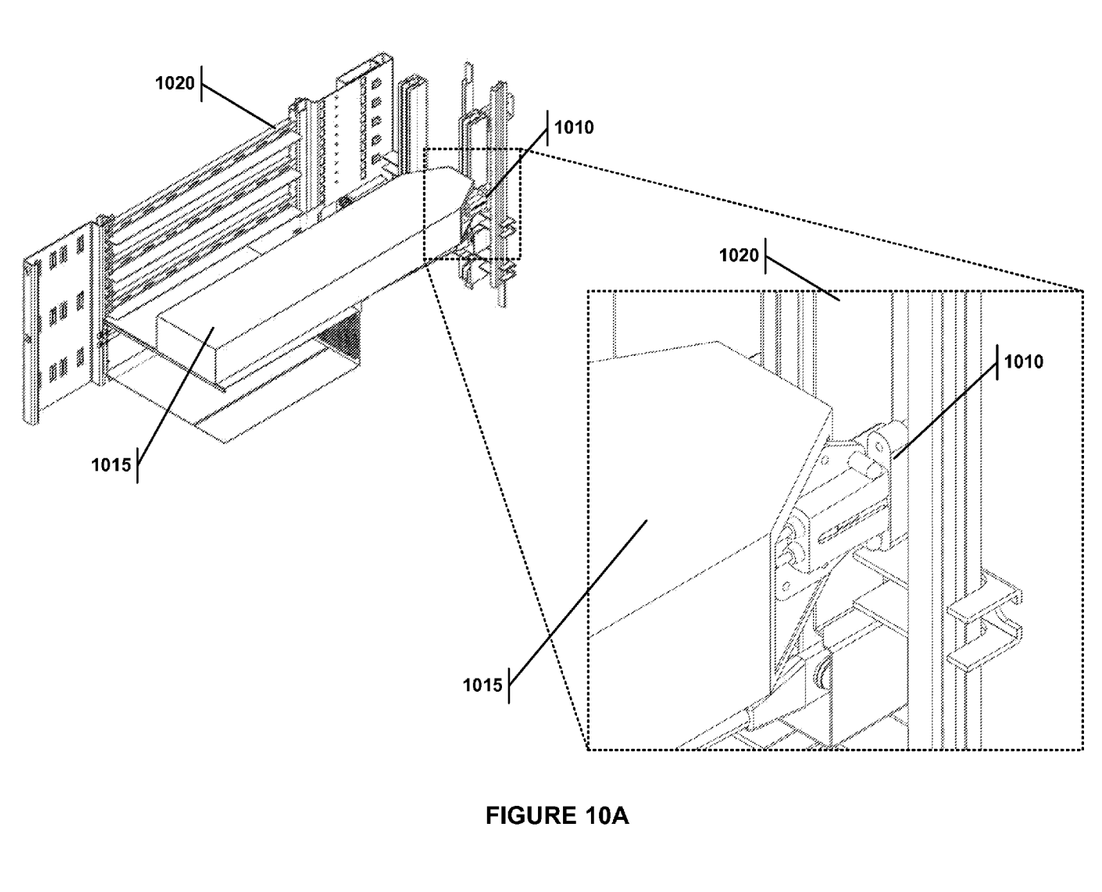
FIG. 10A illustrates a blind mate connection using the connector.
Figure 10B:
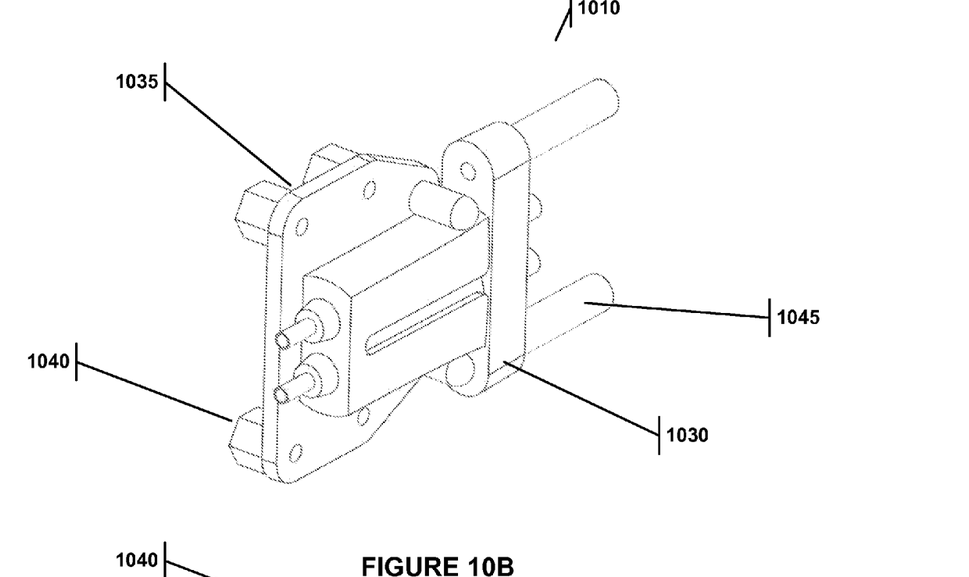
FIG. 10B illustrates a blind mate connector.
Figure 10C:
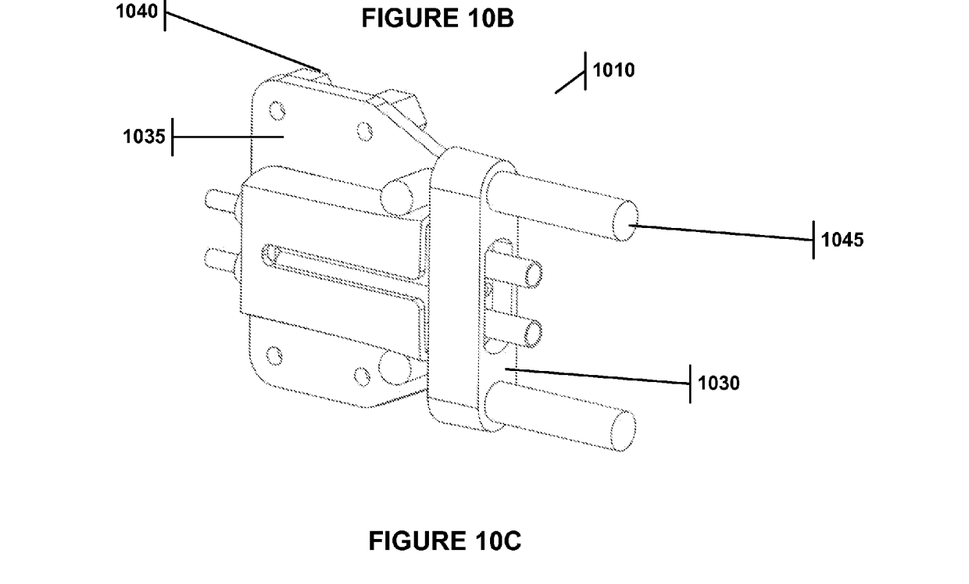
FIG. 10C illustrates a blind mate connector.
Figure 10D:
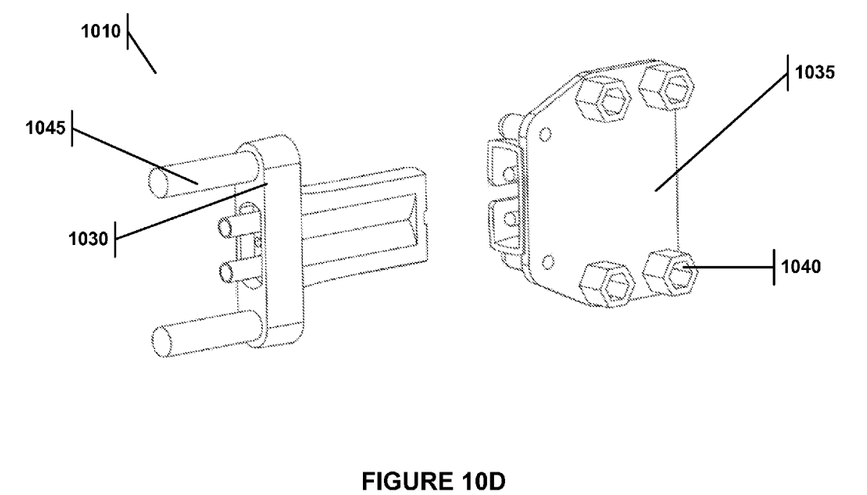
FIG. 10D illustrates a blind mate connector.
Figure 10E:
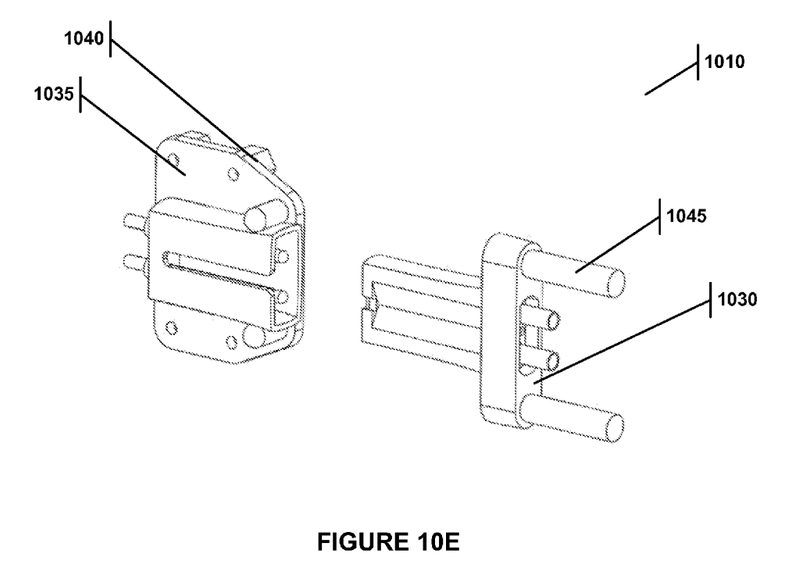
FIG. 10E illustrates a blind mate connector.

In FIG. 10A, the connector 1010 is shown built into a component, in this case a server 1015 that is to be installed into a server rack 1020. When the user pushes the server 1015 into the rack 1020, the component side of the connector is in a predetermined location such that when it slides in the rack 1020, the component side mates with the pumping side which is also in a predetermined location. Because there is a little play in the server rack to allow for easy alignment, it may be advantageous to allow the pumping side of the connector a little play as well. It also may be advantageous to shape the receiving end of the pumping side connector in a wedge shape to more easily mate the connector. If the user needs to remove the server 1015, the user pulls the server 1015 out of the rack 1020. To make certain that the server is drained sufficiently of coolant, the connector may have a delay structure. Because the user cannot see the connection of the two components of the connector, this is called a blind mate.

In FIG. 10B, 10C, 10D and 10E the blind mate connector 1010 is shown in greater detail. The connector has two components, the pumping side 1030 and the component side 1035. The component side 1035 has threaded nuts 1040 to allow the component side 1035 to be affixed to the component. The pumping side 1030 may also have bolts 1045 to allow the pumping side 1030 to be affixed to the rack. As described above, while the component side 1035 may affixed to the component and the pumping side 1030 to the rack, it preferably may have some play or wiggle-room in either or both the pumping side 1030 and component side 1035 to allow the component side 1035 to have a better opportunity to fully mate.

Another alternate embodiment would utilize different length pins pressing on spring-loaded poppet valves, as in quick connect coupling described in U.S. Pat. No. 4,436,125. In this way, when the connector is in the intermediate position, one pin is pushing a poppet valve open and another is not yet engaged. Because the valve operates under vacuum, the poppet valves may need to be of the balanced type, so that the vacuum does not cause them to open prematurely.

The invention has been described in connection with specific embodiments that illustrate examples of the invention but do not limit its scope. Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A hot-swap pump side connector for use in a negative pressure coolant system having a pump that circulates coolant through the system, the pump side connector adapted to mate with a component side connector that contains a return conduit pin and a supply conduit pin that are both in hydraulic connection with an electrical component, the pump side connector comprising:

a return valve and a supply valve constructed such that, during the operation of the pump:

when the pump side connector is in a disengaged position both the return and supply valves are closed and sealed against ambient positive pressure;

when the pump side connector is in a semi-engaged position with the component side connector (1) the return valve forms a hydraulic seal with the return conduit pin, (2) the supply conduit pin is hydraulically exposed to ambient positive pressure such that the pump draws ambient gas through the supply conduit pin, and (3) the supply valve is closed such that coolant does not pass the supply valve and sealed against ambient positive pressure; and when the pump side connector is in a fully-engaged position with the component side connector (1) the return valve forms a hydraulic seal with the return conduit pin, and (2) the supply valve forms a hydraulic seal with the supply conduit pin;

wherein the return valve and the supply valve are fixed relative to each other and staggered such that the return valve engages the return conduit pin before the supply valve engages the supply conduit pin when the pump side connector is mated with the component side connector.

2. The pump side connector of claim 1, wherein the return and supply valves are selected from a group consisting of: a duckbill valve, a slit disk and a hole disk.

3. The pump side connector of claim 1, wherein the return valve comprises:

a first seal constructed to seal against ambient positive pressure when the return valve is not engaged with the return conduit pin; and a second seal constructed to form a hydraulic seal with the return conduit pin when the return valve is engaged with the return conduit pin.

4. The pump side connector of claim 1, wherein the pump side connector is keyed such that it can mate with the component side connector in one orientation.

5. The pump side connector of claim 1, further comprising a delay structure.

6. The pump side connector of claim 5, wherein the delay structure is selected from a group consisting of: a latch and a plunger.

7. The pump side connector of claim 1, further comprising an audible indicator that makes noise when the pump side connector is in the semi-engaged position.

8. The pump side connector of claim 1, further comprising retaining clips enveloping the return and supply valves.

9. The pump side connector of claim 1, further comprising compliant structures adapted to exert force on the return and supply valves to assist the return and supply valves in sealing against ambient positive pressure when the return and supply valves are not engaged with the return and supply conduit pins.

10. A hot-swap connector for use in a negative pressure coolant system having a pump that circulates coolant through the system, the system circulating coolant to an electrical component, the connector comprising:

a component side connector comprising a return conduit pin and a supply conduit pin that are both adapted to be in hydraulic connection with the electrical component;

a hot-swap pump side connector adapted to mate with the component side connector, the pump side connector comprising:

a return valve and a supply valve constructed such that, during the operation of the pump:

when the pump side connector is in a disengaged position both the return and supply valves are closed and sealed against ambient positive pressure;

when the pump side connector is in a semi-engaged position with the component side connector (1) the return valve forms a hydraulic seal with the return conduit pin, (2) the supply conduit pin is hydraulically exposed to ambient positive pressure such that the pump draws ambient gas through the supply conduit pin, and (3) the supply valve is closed such that coolant does not pass the supply valve and sealed against ambient positive pressure; and when the pump side connector is in a fully-engaged position with the component side connector (1) the return valve forms a hydraulic seal with the return conduit pin, and (2) the supply valve forms a hydraulic seal with the supply conduit pin, thereby allowing the coolant to circulate to the electrical component;

wherein the return conduit pin and the supply conduit pin are fixed relative to each other and staggered such that the return valve engages the return conduit pin before the supply valve engages the supply conduit pin when the pump side connector is mated with the component side connector.

11. The connector of claim 10, wherein the return and supply valves are selected from a group consisting of: a duckbill valve, a slit disk and a hole disk.

12. The connector of claim 10, wherein the return valve comprise:
   a first seal constructed to sealed against ambient positive pressure when the return valve is not engaged with the return conduit pin; and
   a second seal constructed to forms a hydraulic seal with the return conduit pin when the return valve is engaged with the return conduit pin.

13. The connector of claim 10, wherein the pump side connector is keyed such that it can mate with the component side connector in one orientation.

14. The connector of claim 10, further comprising a delay structure.

15. The connector of claim 14, wherein the delay structure comprises a latch on the pump side connector and a latch receiver on the component side connector.

16. The connector of claim 14, wherein the delay structure is selected from a group consisting of: a latch and a plunger.

17. The connector of claim 10, further comprising an audible indicator that makes noise when the pump side connector is in the semi-engaged position.

18. The connector of claim 10, further comprising retaining clips enveloping the return and supply valves.

19. The connector of claim 10, further comprising compliant structures adapted to exert force on the return and supply valves to assist the return and supply valves in sealing against ambient positive pressure when the return and supply valves are not engaged with the return and supply conduit pins.

20. The connector of claim 10, wherein the return conduit pin has a first port and the supply conduit pin has a second port, wherein the first and second ports are constructed so as restrict coolant from escaping either the return conduit pin or the supply conduit pin under ambient positive pressure.

21. The connector of claim 10, wherein the return conduit pin has a first port and the supply conduit pin has a second port, wherein the size of the first and second ports are selected so as restrict coolant from escaping either the return conduit pin or the supply conduit pin under positive pressure.

22. The connector of claim 10, wherein the connector is a blind mate connector.

23. A method of draining coolant from an electrical component connected to a negative pressure coolant system having a pump that circulates coolant through the system, the method comprising:
   (a) providing a connector that connects the negative pressure coolant system to the electrical component, the connector comprising a pump side connector adapted to mate with a component side connector that contains a return conduit pin and a supply conduit pin in hydraulic connection with the electrical component, the pump side connector comprising a return valve and a supply valve constructed such that: when the pump side connector is in a semi-engaged position with the component side connector (1) the return valve forms a hydraulic seal with the return conduit pin, (2) the supply conduit pin is hydraulically exposed to positive pressure, and (3) the supply valve is closed and sealed against positive pressure;
   (b) during the operation of the pump, placing the pump side connector in the semi-engaged position, thereby allowing the pump to draw ambient gas through the supply conduit pin and draw the coolant out of the electrical component into the negative pressure coolant system through the return valve; and
   (c) maintaining the pump side connector in the semi-engaged position a sufficient amount of time to drain the coolant from the electrical component.

24. The method of claim 23 wherein when the pump side connector is in a disengaged position both the return and supply valves are closed and sealed against the positive pressure, the method further comprising placing the pump side connector in the disengaged position, thereby disconnecting the electrical component from the negative pressure coolant system.

25. The method of claim 23, the connector further comprising a delay structure, wherein the sufficient amount of time of step (c) is caused at least in part by the delay structure.

26. The method of claim 25 wherein the delay structure is a latch, wherein the wherein the sufficient amount of time of step (c) is caused at least in part by actuating the latch.

27. The method of claim 23, the connector further comprising an audible indicator that makes noise dependent on the amount of coolant in the electrical component, wherein the sufficient amount of time of step (c) is based on the audible characteristics of the audible indicator.

28. A hot-swap pump side connector in combination with a negative pressure coolant system having a pump that circulates coolant through the system, the pump side connector adapted to mate with a component side connector that contains a return conduit pin and a supply conduit pin that are both in hydraulic connection with an electrical component, the pump side connector comprising:
   a return valve and a supply valve constructed such that, during the operation of the pump:
      when the pump side connector is in a disengaged position both the return and supply valves are closed and sealed against ambient positive pressure;
      when the pump side connector is in a semi-engaged position with the component side connector (1) the return valve forms a hydraulic seal with the return conduit pin, (2) the supply conduit pin is hydraulically exposed to ambient positive pressure such that the pump draws ambient gas through the supply conduit pin, and (3) the supply valve is closed such that coolant does not pass the supply valve and sealed against ambient positive pressure; and
      when the pump side connector is in a fully-engaged position with the component side connector (1) the return valve forms a hydraulic seal with the return conduit pin, and (2) the supply valve forms a hydraulic seal with the supply conduit pin.

* * * * *